US010855320B2

(12) United States Patent
Filipovic et al.

(10) Patent No.: US 10,855,320 B2
(45) Date of Patent: Dec. 1, 2020

(54) ANTENNA APERTURE TUNING

(71) Applicant: QUALCOMM Incorporated, San Diego, CA (US)

(72) Inventors: Daniel Filipovic, Solana Beach, CA (US); Jarred Moore, San Diego, CA (US); Maurice Adrianus De Jongh, Nijmegen (NL); Anton Arriagada, San Marcos, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/144,670

(22) Filed: Sep. 27, 2018

(65) Prior Publication Data
US 2020/0106467 A1 Apr. 2, 2020

(51) Int. Cl.
*H04B 1/16* (2006.01)
*H03H 7/38* (2006.01)
*H04B 1/18* (2006.01)

(52) U.S. Cl.
CPC ............. *H04B 1/1638* (2013.01); *H03H 7/38* (2013.01); *H04B 1/18* (2013.01)

(58) Field of Classification Search
CPC combination set(s) only.
See application file for complete search history.

(56) References Cited

U.S. PATENT DOCUMENTS

| | | | | |
|---|---|---|---|---|
| 3,909,830 A | * | 9/1975 | Campbell | ............. H01Q 9/32 343/703 |
| 5,031,233 A | | 7/1991 | Ragan | |
| 8,081,940 B2 | | 12/2011 | Rofougaran | |
| 8,463,215 B2 | | 6/2013 | Kasha et al. | |
| 9,647,630 B2 | | 5/2017 | Li et al. | |
| 2007/0224948 A1 | * | 9/2007 | Hartenstein | ............. H01Q 9/14 455/101 |
| 2013/0005277 A1 | * | 1/2013 | Klomsdorf | ........... H01Q 1/2266 455/77 |
| 2013/0005278 A1 | * | 1/2013 | Black | ................... H01Q 1/241 455/77 |
| 2013/0295863 A1 | | 11/2013 | Shanan | |

(Continued)

*Primary Examiner* — Junpeng Chen
(74) *Attorney, Agent, or Firm* — QUALCOMM Incorporated

(57) ABSTRACT

An antenna system includes: a radiating element; a feed coupled to the radiating element at a first point on the radiating element and configured to convey energy to the radiating element; and a radiation-adjustment device coupled to the radiating element at a second point, configured to alter a radiation characteristic of the radiating element, and including: coarse-adjustment elements; an integrated-circuit chip including: switches, each coupled to a respective one of the coarse-adjustment elements where the coarse-adjustment elements are disposed external to the integrated-circuit chip; and a fine-adjustment circuit; the antenna system further including a controller communicatively coupled to the switches and to the fine-adjustment circuit, the controller configured to alter the radiation characteristic of the radiating element by selectively causing one or more of the switches to couple one or more of the coarse-adjustment elements to the radiating element, and by adjusting a value of the fine-adjustment circuit.

28 Claims, 8 Drawing Sheets

(56) References Cited

U.S. PATENT DOCUMENTS

| | | | |
|---|---|---|---|
| 2016/0126619 A1* | 5/2016 | Tenbroek | H03H 7/40 |
| | | | 343/745 |
| 2016/0268992 A1* | 9/2016 | Salfelner | H03H 7/40 |
| 2017/0170564 A1* | 6/2017 | Velandia Torres | H01Q 7/005 |
| 2017/0346178 A1* | 11/2017 | Shi | H04B 17/102 |

* cited by examiner

ANTENNA APERTURE TUNING

BACKGROUND

Wireless communication devices are increasingly popular and increasingly complex. For example, mobile telecommunication devices have progressed from simple phones, to smart phones with multiple communication capabilities (e.g., multiple cellular communication protocols, Wi-Fi, BLUETOOTH® and other short-range communication protocols), supercomputing processors, cameras, etc. Wireless communication devices have antennas to support communication over a range of frequencies. An antenna by itself may not have adequate performance (e.g., sufficiently low loss) over an entire desired frequency range for desired communication functionality (e.g., transmit and receive). Further, as feature sets of devices increase, more space is taken up by hardware used to support the features, often reducing the space available for each antenna, which may reduce the antenna efficiency or otherwise affect performance. To help maintain adequate performance, an aperture tuner may be used.

SUMMARY

An example of an antenna system includes: a radiating element; a feed coupled to the radiating element at a first point on the radiating element and configured to convey energy to the radiating element; and a radiation-adjustment device coupled to the radiating element at a second point on the radiating element different from the first point, the radiation-adjustment device being configured to alter a radiation characteristic of the radiating element and including: a plurality of coarse-adjustment elements; an integrated-circuit chip including: a plurality of switches each coupled to a respective one of the plurality of coarse-adjustment elements wherein the plurality of coarse-adjustment elements are disposed external to the integrated-circuit chip; and a fine-adjustment circuit; the antenna system further including a controller communicatively coupled to the plurality of switches and to the fine-adjustment circuit, the controller being configured to alter the radiation characteristic of the radiating element by selectively causing one or more of the plurality of switches to couple one or more of the plurality of coarse-adjustment elements to the radiating element, and by adjusting a value of the fine-adjustment circuit.

Implementations of such an antenna system may include one or more of the following features. The plurality of coarse-adjustment elements include one or more inductors, or one or more capacitors, or a combination thereof. The fine-adjustment circuit includes a variable capacitor. The controller is configured to adjust the value of the fine-adjustment circuit dynamically in response to changing resonant frequency of the radiating element. The fine-adjustment circuit is coupled to a local ground on the integrated-circuit chip. The plurality of coarse-adjustment elements and a fine-adjustment element of the fine-adjustment circuit are complementary metal-oxide semiconductor devices. The radiation characteristic is radiation efficiency. The fine-adjustment circuit is coupled to the radiating element. The fine-adjustment circuit is coupled to at least one of the plurality of switches. The plurality of switches is a plurality of first switches, a first port of each of the plurality of first switches is coupled to the radiating element, a second port of each of the plurality of first switches is coupled to a respective one of the plurality of coarse-adjustment elements, and the radiation-adjustment device further includes a plurality of second switches each coupled between the second port of a respective one of the plurality of first switches and a local ground on the integrated-circuit chip. The integrated-circuit chip includes the controller.

An example of a wireless communication device includes: a housing; a display retained by the housing; a printed circuit board communicatively coupled to the display and disposed in the housing; and an antenna communicatively coupled to the printed circuit board, disposed in the housing, and including: a radiating element including a strip of metal disposed proximate to a wall of the housing; a feed coupled to the radiating element at a first location, the feed configured to provide signals to the radiating element; and an aperture tuner coupled to the radiating element at a second location, displaced from the first location, the aperture tuner including an integrated-circuit chip and a band-selecting tuning element disposed external to the integrated-circuit chip, the integrated circuit chip configured to selectively couple to the band-selecting tuning element such that the radiating element will radiate with at least a threshold level of efficiency over a first frequency band while coupled to the band-selecting tuning element and over a second frequency band, separate from the first frequency band, while isolated from the band-selecting tuning element, the integrated-circuit chip including a fine-tuning element configured to adjust a resonant frequency of the radiating element within the first frequency band and the second frequency band.

Implementations of such a device may include one or more of the following features. The band-selecting tuning element includes an inductor. The fine-tuning element includes a variable capacitor. The fine-tuning element is coupled to the radiating element. The fine-tuning element is selectively coupled to the band-selecting tuning element. The aperture tuner includes a first band-selecting tuning element, the aperture tuner further including a second band-selecting tuning element, the integrated circuit chip configured to selectively couple to the second band-selecting tuning element such that the radiating element will radiate with at least the threshold level of efficiency over a third frequency band, separate from the first frequency band and the second frequency band, while coupled to the second band-selecting tuning element. The aperture tuner includes a plurality of band-selecting tuning elements each selectively coupled to the integrated-circuit chip such that the aperture tuner is configured to cause the radiating element to radiate with at least the threshold level of efficiency over a selected one of a plurality of frequency bands including the first frequency band and the second frequency band. A lowest frequency in the plurality of frequency bands is separated by at least 600 MHz from a highest frequency in the plurality of frequency bands.

Also or alternatively, implementations of such a device may include one or more of the following features. The plurality of band-selecting tuning elements includes two or more inductors, or two or more capacitors, or a combination of one or more inductors and one or more capacitors. The device may further include a controller configured to cause a value of the fine-tuning element to change in response to a change in the resonant frequency of the radiating element. The controller is configured to cause the value of the fine-tuning element to change to counteract the change in the resonant frequency of the radiating element.

An example of an antenna includes: radiating means for radiating electromagnetic energy; signal means for providing a signal to the radiating means; means for tuning the radiating means to have a reflection coefficient below a threshold value over a desired frequency band; and an integrated circuit coupled to the means for tuning, the means for tuning being external to the integrated circuit, the integrated circuit including: means for selecting the means for tuning; and means for adjusting the means for tuning to adjust the desired frequency band.

Implementations of such an antenna may include one or more of the following features. The means for tuning are for tuning the radiating means to have the reflection coefficient below the threshold value over a selected one of a first plurality of desired frequency bands having center frequencies separated by first increments, and the means for adjusting are for adjusting the means for tuning to adjust the desired frequency band to an adjusted frequency band between adjacent ones of the first plurality of desired frequency bands. The means for adjusting are for adjusting the means for tuning to adjust the desired frequency band to a selected one of a second plurality of desired frequency bands having center frequencies separated by second increments that are smaller than the first increments.

An example of an antenna aperture tuner includes: an output pin configured to be coupled to a radiating element; a plurality of coarse-adjustment pins; a plurality of switches each coupled to the output pin and to a corresponding one of the plurality of coarse-adjustment pins; and a fine-adjustment circuit coupled to the output pin; where the plurality of switches are configured to couple one or more of the plurality of coarse-adjustment pins to the output pin and where the fine-adjustment circuit is configured to provide a selectable reactance to the output pin.

Implementations of such an antenna aperture tuner may include one or more of the following features. The antenna aperture tuner may further include a controller communicatively coupled to the plurality of switches and to the fine-adjustment circuit and configured to actuate the plurality of switches to couple one or more of the plurality of coarse-adjustment pins to the output pin and to control the fine-adjustment circuit to provide a selected reactance to the output pin. The controller is configured to control the fine-adjustment circuit dynamically in response to changing resonant frequency of the radiating element. The antenna aperture tuner may further include a Unique Slave Identifier port, a Voltage Input/Output port, a data port, a clock port, and a ground port, where the controller is coupled to the Unique Slave Identifier port, the Voltage Input/Output port, the data port, the clock port, and the ground port. The fine-adjustment circuit includes a variable capacitor in parallel with a discharge short.

DETAILED DESCRIPTION

Techniques are discussed herein for tuning an aperture of a radiating element of an antenna. For example, an aperture tuner is connected to the radiating element at a location displaced from where a feed connects to the radiating element for supplying a signal to be radiated or for receiving incoming signals. The aperture tuner includes multiple coarse-adjustment elements and an integrated-circuit chip. The chip has multiple switches connected to the coarse-adjustment elements, and a fine-adjustment element. A controller can cause the switches to connect, or not, one or more of the coarse-adjustment elements to the radiating element and can set a value of the fine-adjustment element in order to tune the radiating element as desired. The radiating element can be tuned dynamically in accordance with a changing resonant frequency of the radiating element. The coarse-adjustment elements may, for example, be inductors and the fine-adjustment element may, for example, be a variable capacitor. Further, the fine-adjustment element may be selectively (either permanently or temporarily) connected to one or more outputs corresponding to one or more coarse-adjustment elements, e.g., in parallel, and the combination(s) of the fine-adjustment element and the coarse-adjustment element(s) selectively coupled to the radiating element. These examples are not exhaustive, and other configurations may be used.

Items and/or techniques described herein may provide one or more of the following capabilities, as well as other capabilities not mentioned. An antenna can be tuned to operate over a wide tuning range, e.g., 600 MHz, with good efficiency. An antenna can be tuned to adapt to one or more changes in environmental conditions to radiate efficiently at a desired frequency. Both coarse and fine-tuning of an antenna aperture can be provided. Other capabilities may be provided and not every implementation according to the disclosure must provide any, let alone all, of the capabilities discussed. Further, it may be possible for an effect noted above to be achieved by means other than that noted, and a noted item/technique may not necessarily yield the noted effect.

Figure 1:
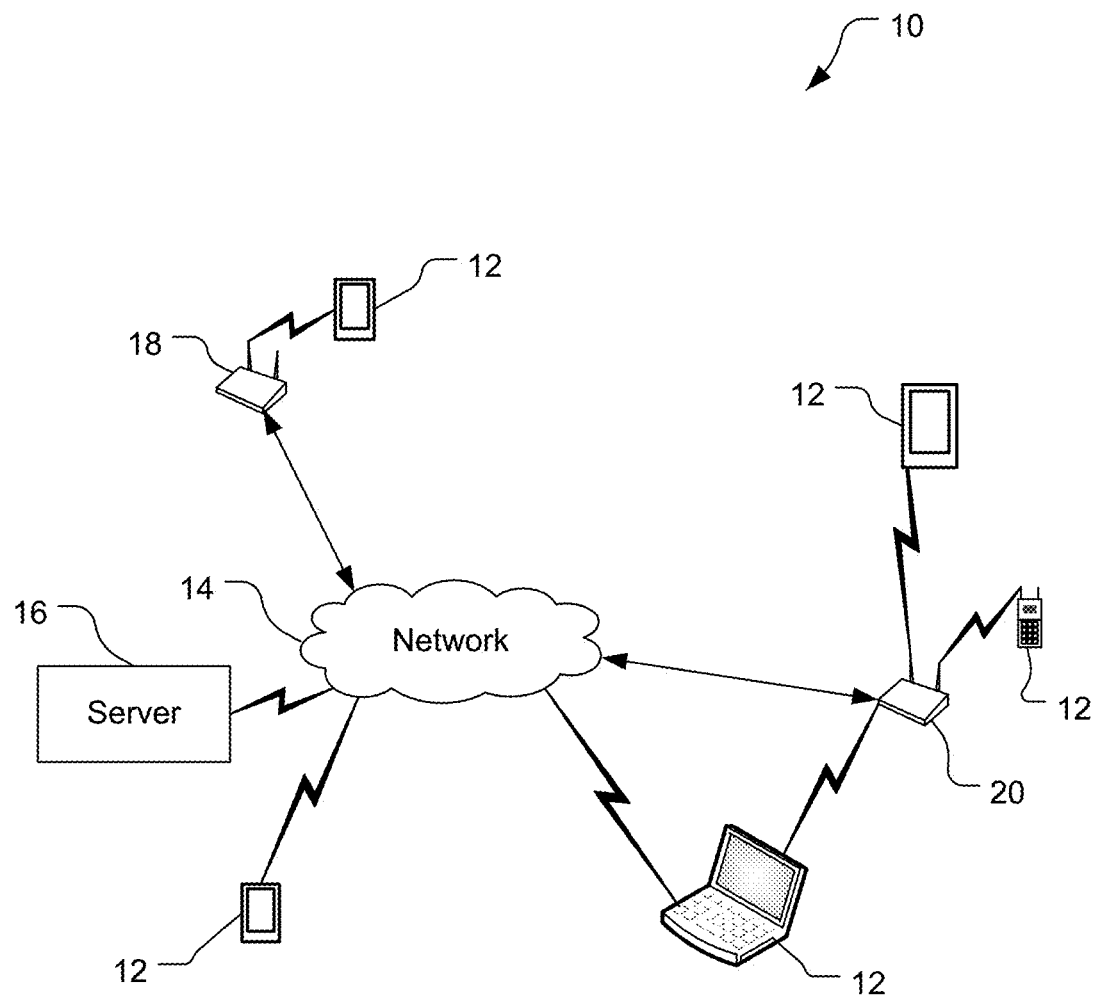
FIG. 1 is a schematic diagram of a communication system.

Referring to FIG. 1, a communication system 10 includes wireless communication devices 12, a network 14, a server 16, and access points (APs) 18, 20. The system 10 is a communication system in that components of the system 10 can communicate with one another directly or indirectly, e.g., via the network 14 and/or one or more of the access points 18, 20 (and/or one or more other devices not shown, such as one or more base transceiver stations). For indirect communications, the communications may be altered during transmission from one entity to another, e.g., to alter header information of data packets, to change format, etc. The example wireless communication devices 12 shown include mobile phones (including smartphones), a laptop computer, and a tablet computer. Still other mobile devices may be used, whether currently existing or developed in the future.

Figure 2:
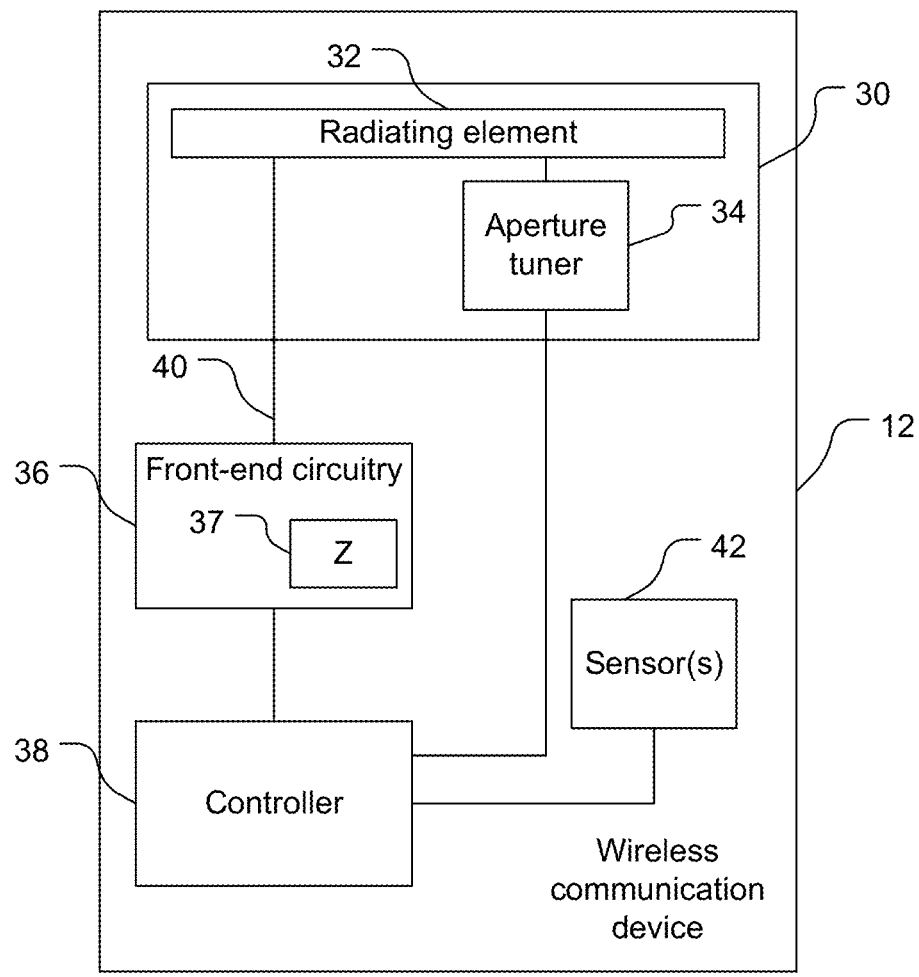
FIG. 2 is a block diagram of components of a wireless communication device shown in FIG. 1.

Referring also to FIG. 2, an example of any of the wireless communication devices 12 includes an antenna 30, that includes a radiating element 32 and an aperture tuner 34, front-end circuitry 36, and a controller 38. The front-end circuitry 36 is communicatively coupled to the controller 38 by one or more transmission lines, and is connected to the radiating element 32 by a feed 40. In some embodiments, the front-end circuitry 36 may include an impedance matching circuit 37. For example, the feed 40 may be coupled to the impedance matching circuit 37 of the front-end circuitry 36. The impedance matching circuit 37 is configured to attempt to match the output impedance of the front-end circuitry 36 to the input impedance of the radiating element 32 to reduce loss by reducing reflection of signals from the front-end circuitry 36 by the radiating element 32. The front-end circuitry 36 and the aperture tuner 34 are coupled to the radiating element 32 at different, spaced apart locations. The locations of the connections to the radiating element 32 may be selected based on the physical configuration of the radiating element 32 and the effects on tunability and losses of the locations of the connections, and based on the voltage requirements of the radiating element 32. The controller 38 and the front-end circuitry 36 may provide multiple signal chains that may be used, for example, to communicate in different networks and/or for different purposes (e.g., Wi-Fi communication, multiple frequencies of Wi-Fi communication, satellite positioning, one or more types of cellular communications (e.g., GSM (Global System for Mobiles), CDMA (Code Division Multiple Access), LTE (Long-Term Evolution), 5G, etc.). The controller 38 may be configured to send communication signals to, and to receive communication signals from, the front-end circuitry 36. The controller 38 may be configured to produce an outbound communication signal, for example in a baseband, and to send this signal to a transmitter of the front-end circuitry 36. The communication signal provides appropriate information, e.g., outgoing voice, uploading data, etc. for transmission by the front-end circuitry 36, e.g., to a cellular tower, an access point, etc., via the radiating element 32. The controller 38 may be further configured to receive an inbound communication signal from a receiver of the front-end circuitry 36 received via the radiating element 32. The sensor(s) 42 comprise one or more sensors configured to measure one or more environmental conditions and provide one or more corresponding indications to the controller 38. For example, the sensor(s) 42 include a temperature sensor configured to measure and provide an indication of the temperature of the wireless communication device 12, e.g., of a printed circuit board (PCB), of the wireless communication device 12, that comprises the front-end circuitry 36, the controller 38, and the sensor(s) 42.

The controller 38 may be configured to provide control signals to the aperture tuner 34 to control tuning of the radiating element 32 by the aperture tuner 34. For example, the controller 38 may be configured to respond to selection of a communication protocol, e.g., by selection of a cellular service provider (e.g., according to a subscriber identification module in the wireless communication device 12), by sending control signals to the aperture tuner 34 to tune the radiating element 32 for good efficiency at the frequency corresponding to the selected cellular service provider. The control signals may directly cause the aperture tuner 34 to tune the radiating element 32, e.g., by directly causing one or more switches to be open or closed and/or to set a value of a variable element, or may indirectly cause the aperture tuner 34 to tune the radiating element, e.g., by being interpreted and converted to further control signals within the aperture tuner 34 as discussed below. The control signals (or further control signals) may selectively actuate one or more switches of the aperture tuner 34 to tune the radiating element 32. The controller 38 may produce and send signals to DATA and CLK ports (discussed further below) of the tuner 34 in order to cause the tuner 34 to set switches to provide desired tuning (e.g., impedance). The controller 38 may be configured to produce the signals for the DATA and/or CLK ports based on a desired frequency band of operation of the radiating element 32 that the tuner 34 converts into control signals for selectively opening and closing appropriate ones of the switches.

Figure 3:
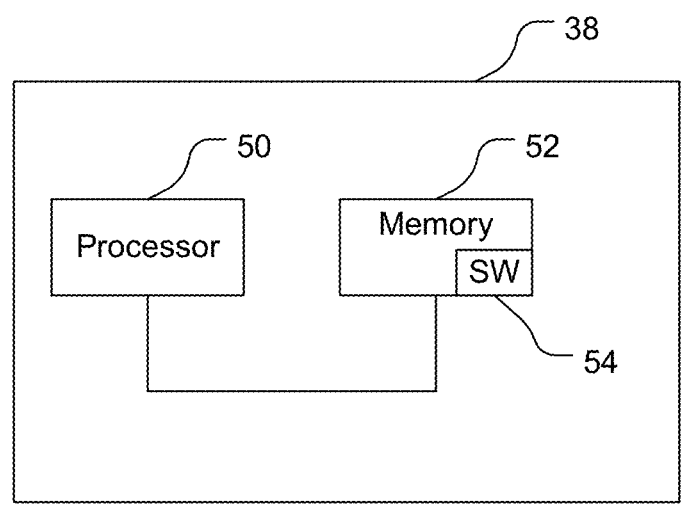
FIG. 3 is a block diagram of components of a controller shown in FIG. 2.

Referring also to FIG. 3, the controller 38 comprises a computer system including a processor 50 and memory 52, including software 54. The processor 50 may be an intelligent hardware device, e.g., a central processing unit (CPU) such as those made by QUALCOMM®, ARM®, Intel® Corporation, or AMD®, a microcontroller, an application specific integrated circuit (ASIC), etc. The processor 50 could comprise multiple separate physical entities that can be distributed in the wireless communication device 12. The memory 52 is a non-transitory storage medium that includes random access memory (RAM) and read-only memory (ROM). The memory 52 stores the software 54 which is processor-readable, processor-executable software code containing instructions that are configured to, when executed, cause the processor 50 to perform various functions described herein (although the description may refer only to the processor 50, or the controller 38, performing the functions). Alternatively, the software 54 may not be directly executable by the processor 50 but configured to cause the processor 50, e.g., when compiled and executed, to perform the functions. The controller 38 is disposed externally to an integrated circuit chip of the aperture tuner 34 (i.e., a tuner chip), and may be part of a modem processor and/or part of an applications processor, etc.

Figure 4:
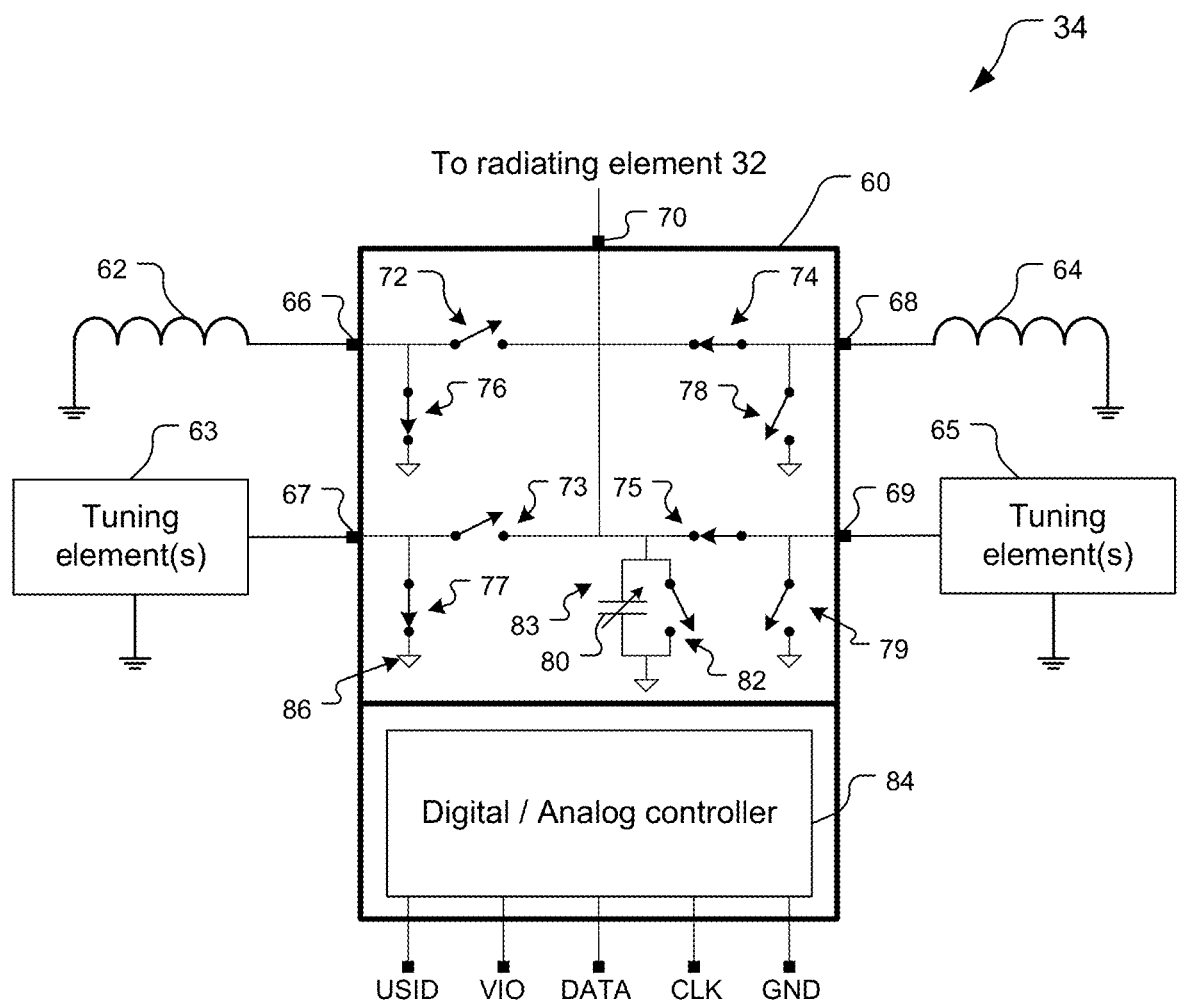
FIG. 4 is a block diagram of components of an example of an aperture tuner shown in FIG. 2.
Figure 5:
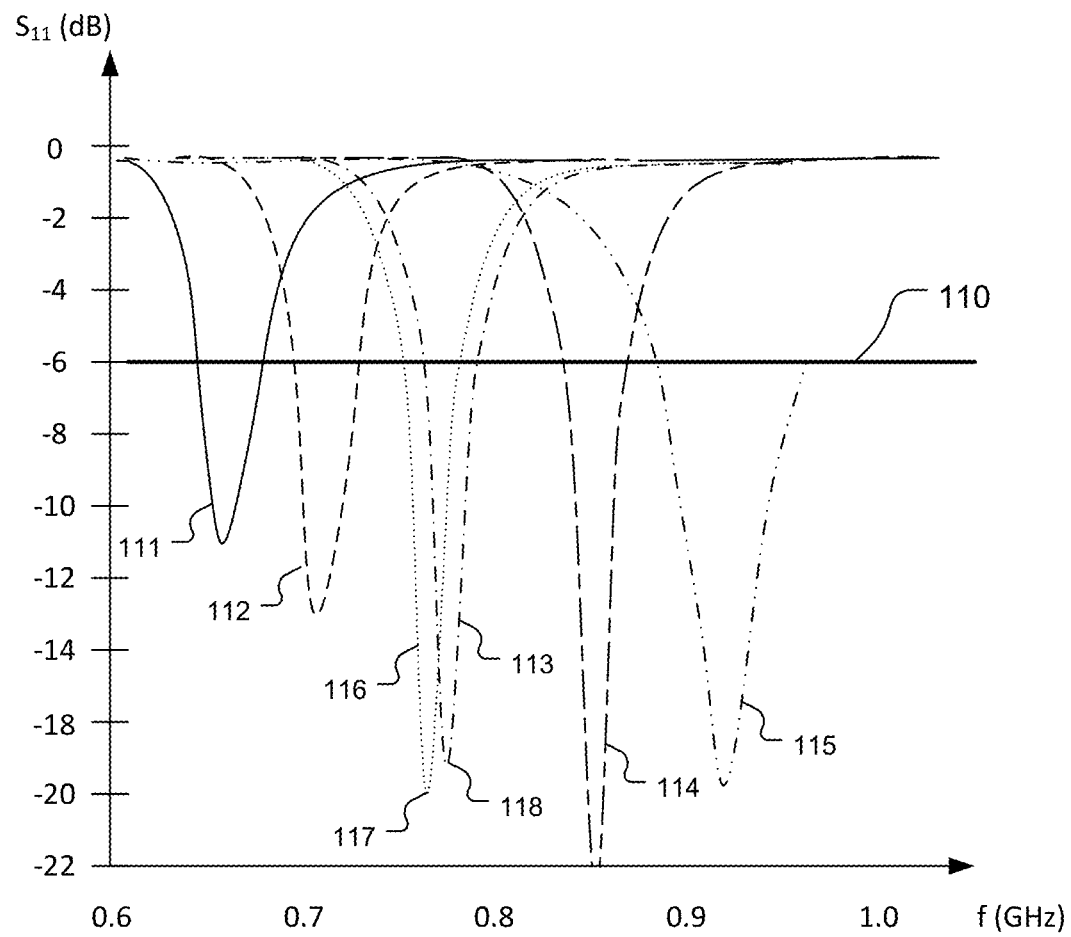
FIG. 5 is a diagram of plots of reflection coefficient for different configurations of adjustment elements shown in FIG. 4.

Referring to FIG. 4, with further reference to FIG. 2, an example of the aperture tuner 34 comprises an integrated-circuit (IC) chip 60 and coarse-adjustment elements 62, 63, 64, 65. The IC chip 60 includes pins 66, 67, 68, 69 coupled (directly or indirectly) to the coarse-adjustment elements 62, 63, 64, 65, respectively, and a pin 70 connected to the radiating element 32. The IC chip 60 includes switches 72, 73, 74, 75, 76, 77, 78, 79, a fine-adjustment element 80, an electrostatic-discharge short 82, and a digital/analog controller 84. The coarse-adjustment elements 62-65 are configured to affect a radiation frequency of the radiating element 32 in large increments (e.g., in steps of about 70 MHz as shown in FIG. 5) while the fine-adjustment element 80 may be configured to vary the radiation frequency of the radiating element 32 in smaller increments over a range of about one large increment of the coarse-adjustment elements 62-65. The size of the coarse increments may be, for example, three, four, or five, etc. times the size of the small increments of the fine-adjustment element 80 and may depend on a granularity of increments/variation of the fine-adjustment element 80. Here, the coarse-adjustment elements 62, 64 are inductors and the coarse-adjustment elements 63, 65 may be inductors, capacitors, or a combination thereof. Thus, each of the coarse-adjustment elements 62-65 comprises one or more reactances. The coarse-adjustment elements 62, 64 may not be inductors in other implementations, instead being capacitors, a combination of an inductor and a capacitor, or other configuration. Further, as used herein, an inductor may comprise multiple physical components and a capacitor may comprise multiple physical components. In the example shown in FIG. 4, the fine-adjustment element 80 is a variable reactance, here a variable capacitor, but other configurations of the fine-adjustment element 80 may be used. The aperture tuner 34 is configured to selectively alter a radiation characteristic, e.g., a radiation efficiency and/or an antenna pattern, of the radiating element 32. One or more of the coarse-adjustment elements 62-65 and/or the fine-adjustment element 80 made be a complementary metal-oxide semiconductor device. The fine-adjustment element 80 and the discharge short 82 are coupled in parallel and form a fine-adjustment circuit 83. The discharge short 82 is configured to close in response to an electrical surge, e.g., due to electrostatic discharge, to bypass the fine-adjustment element, shorting the connection to the radiating element 32 to local ground. Alternatively, a fine-adjustment circuit could have the fine-adjustment element 80 coupled in series with a switch that is coupled to the pin 70 and the switch selectively opened to inhibit the fine-adjustment element 80 affecting the radiating element 32 or closed to facilitate the fine-adjustment element 80 affecting the radiating element 32. Alternatively still, a fine-adjustment circuit may not include a switch or the discharge short 82, e.g., including only the fine-adjustment element 80.

The switches 72-79 are controlled by the controller 84 to open or close to affect the radiation characteristic of the radiating element 32 as desired. The controller 84 is configured to selectively actuate the switches 72-79 to be open or closed to help provide a desired radiation characteristic of the radiating element 32. Here, the controller 84 is shown as being on the IC chip 60, but other configurations may be used where the controller 84 is disposed (all or partially) off the IC chip 60. In the illustrated embodiment, the controller 84 has a USID (Unique Slave ID (Identifier)) port, a VIO (Voltage Input/Output) port, a data (DATA) port, a clock (CLK) port, and a ground (GND) port, but in other embodiments the controller may omit one or more of these ports (for example the USID port). The USID provides a selector for configurations with multiple aperture tuners on a single data bus. Supply voltage for the IC chip 60 (e.g., for the switches 72-79, the capacitor 80, and the controller 84) may be provided via the VIO port. The controller 84 may receive, from the controller 38, signals on the DATA port (that may be bi-directional) and the CLK port that instructs the controller 84 as to which of the switches 72-79 to open and which of the switches 72-79 to close. The controller 84 decodes the values of the signals on the DATA and/or CLK ports into corresponding signals to set each of the switches 72-79 to be open or closed, respectively. The controller 84 may be configured to operate within an RF Front-End Control Interface (RFFE$^{SM}$) defined by the MIPI (Mobile Industry Processor Interface) Alliance. As shown, when a switch (here, the switches 72, 73) selectively coupling a coarse-adjustment element (here, the coarse-adjustment elements 62, 63) to the radiating element 32 is open, then the switch (here, the switches 76, 77) selectively coupling that coarse-adjustment element to the local, on-chip ground 86 is closed. Conversely, when a switch (here, the switches 74, 75) selectively coupling a coarse-adjustment element (here, the coarse-adjustment elements 64, 65) to the radiating element 32 is closed, then the switch (here, the switches 78, 79) selectively coupling that coarse-adjustment element to the local, on-chip ground 86 is open. The aperture tuner 34 may be configured to couple only one coarse-adjustment element (or none) at a time to the radiating element 32 or may be configured to couple combinations of the coarse-adjustment elements to the radiating element 32. Those of skill in the art will understand that a greater or smaller number of ports may be implemented in the IC chip 60. For example, the USID port may be omitted in some implementations. In some embodiments, several data ports may be implemented, and in some such embodiments the controller 84 may be configured to determine how to appropriately configure the switches 72-79 when instructions from multiple sources are received.

The aperture tuner 34 may change the radiation characteristic of the radiating element 32 by selectively coupling one or more of the coarse-adjustment elements 62-65 to the radiating element 32 and/or adjusting a value of the fine-adjustment element 80, e.g., a capacitance. The switches 72-75 may be selectively closed, thereby electrically coupling the respective coarse-adjustment elements 62-65 to the radiating element 32, or opened, thereby electrically isolating the respective coarse-adjustment elements 62-65 from the radiating element 32. The switches 76-79 may be selectively closed, thereby electrically coupling the respective coarse-adjustment elements 62-65 to a local, on-chip ground 86, or opened, thereby electrically isolating the respective coarse-adjustment elements 62-65 from the ground 86. The controller 84 is further configured to provide a control signal to the fine-adjustment element 80 to adjust a value of the fine-adjustment element 80. In some embodiments, the fine-adjustment element 80 is implemented using a plurality of switched capacitors in parallel, and the controller 84 transmits control signals to respective switches of the fine-adjustment element 80 to control whether each of those switches is open or closed. In the closed configuration, the respective capacitor is coupled through the switch to the local ground. As discussed above, control signals may be produced in response to one or more signals received by the controller 84, e.g., on the DATA port and/or the CLK port, from the controller 38. Also or alternatively, the controller 84 may be configured to produce one or more control signals to adjust the value of the fine-adjustment element 80 dynamically in response to changing resonant frequency of the radiating element 32, e.g., due to a change in one or more environmental conditions such as temperature of the antenna 30 as indicated by the sensor(s) 42. The controller 84 may adjust the value of the fine-adjustment element 80 to counteract the changes in the resonant frequency due to the one or more environmental conditions to try to maintain the resonant frequency of the radiating element 32, or at least not have the resonant frequency change so much that the radiating element cannot sufficiently efficiently transmit or receive signals at a desired frequency.

Referring also to FIG. 5, selectively opening and closing the switches 72-75 cause large adjustments to the radiation characteristic, here the radiation efficiency, of the radiating element 32. FIG. 5 shows example plots 111, 112, 113, 114, 115 of reflection coefficient ($S_{11}$) vs. frequency for different coarse-adjustment elements being coupled to the radiating element 32. The coarse-adjustment elements 62-65 in the example of FIG. 5 are all inductors with large inductance values, e.g., 1-60 nH, and can make large changes to a frequency band over which the radiating element 32 radiates efficiently, e.g., radiates more than a threshold amount of input energy and correspondingly reflects less than a threshold 110 amount of the input energy. In FIG. 5, plots 111-115 correspond to the switches 72-75 all being open, only the switch 72 being closed, only the switch 73 being closed, only the switch 74 being closed, and only the switch 75 being closed, respectively. The plots 111-115 show the reflection coefficient at the feed 40 (FIG. 2) for the corresponding configurations of the switches 72-75. As shown, with larger inductance values connected to the radiating element 32 (i.e., going from the plot 111 to the plot 115), the frequencies are higher at which the reflection coefficient is below the threshold 110. That is, the frequency band over which the radiation efficiency is desirable (the efficient radiation frequency band) is higher (i.e., spans higher frequencies) as the inductance coupled to the radiating element 32 increases. The efficient radiation frequency bands corresponding to the coarse-adjustment elements 62-65 correspond to the values of the coarse-adjustment elements 62-65 and the separations of the efficient radiation frequency bands correspond (although not necessarily linearly) to the differences in the values of the coarse-adjustment elements 62-65.

As also shown in FIG. 5, changing the value of the fine-adjustment element 80 causes small changes to the radiation characteristic of the radiating element 32. In this example, as the capacitance of the fine-adjustment element 80 is increased, the efficient radiation frequency band decreases, e.g., a plot corresponding to the switch 73 being closed changes from the plot 113 to a plot 116, with the plot 116 shifted lower in frequency relative to the plot 113. Also, the plot 116 has an efficient radiation frequency band that is slightly larger than for the plot 113, and has a minimum reflection coefficient 117 that is lower than a minimum reflection coefficient 118 for the plot 113. The range of fine-tune adjustment may be larger than as shown with the plots 113, 116, and ranges of fine-tune adjustment are available for each configuration of coupling of the coarse-adjustment elements 62-65 to the radiating element 32.

The quantities and scale illustrated in FIG. 5 are examples only, and embodiments are not limited to those illustrated in FIG. 56. The values of the coarse-adjustment elements 62-65 and the range of values of the fine-adjustment element 80 may be selected such that the efficient radiation frequency bands span frequency ranges of interest. For example, values may be selected such that the efficient radiation frequency bands span frequency ranges (i.e., from a lowest frequency in the range to a highest frequency in the range) used for receiving and transmitting signals for one or more communication protocols such as 4G LTE, 5G LTE, etc. Thus, while frequencies under 1 GHz are illustrated in FIG. 5, the aperture tuner 34 may be configured for use in systems that transmit and/or receive at frequencies below 2 GHz, below 3.5 GHz, etc. The efficient radiation frequency bands may extend over a large range of frequencies, e.g., with a lowest frequency in one of efficient radiation frequency bands differing from a highest frequency in another of the efficient radiation frequency bands by 600 MHz or more (this difference being about 300 MHz as shown in FIG. 5).

Figure 6:
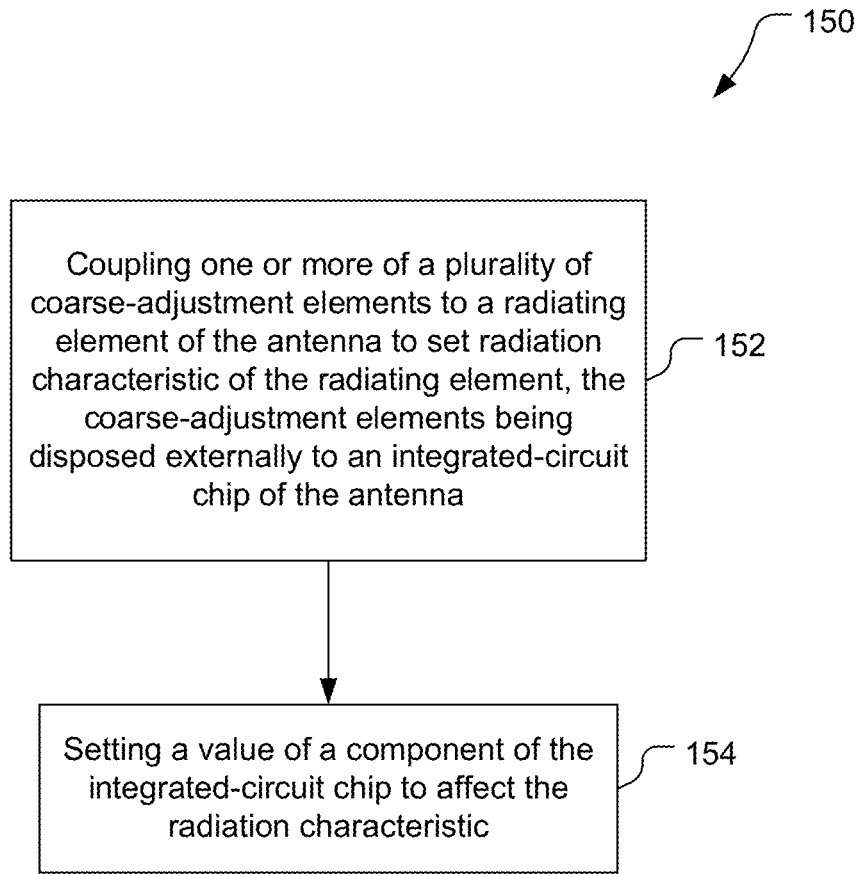
FIG. 6 is a block flow diagram of a method of aperture tuning a radiating element of an antenna.

Referring to FIG. 6, with further reference to FIGS. 1-5, a method 150 of aperture tuning a radiating element of an antenna includes the stages shown. The method 150 is, however, an example only and not limiting.

At stage 152, the method 150 includes coupling one or more of a plurality of coarse-adjustment elements to a radiating element of the antenna to set a radiation characteristic of the radiating element, the coarse-adjustment elements being disposed externally to an integrated-circuit chip of the antenna. For example, the controller 84 can respond to information on the DATA port and/or the CLK port by determining a configuration of the coarse-adjustment elements 62-65, if any, to couple to the radiating element 32. Coupling one or more of the coarse-adjustment elements to the radiating element comprises coupling one or more inductors, or one or more capacitors, or a combination thereof, to the radiating element.

At stage 154, the method 150 includes setting a value of a component of the integrated-circuit chip to affect the radiation characteristic. For example, the controller 84 may send a control signal to set (which may change) the capacitance value of the fine-adjustment element 80. The controller 84 may produce the control signal in response to information from the controller 38, e.g., information regarding one or more measured environmental conditions measured by the sensor(s) 42. The radiation characteristic may be an efficient radiation frequency band and setting the value of the component of the integrated-circuit chip may set a range of the efficient radiation frequency band. As another example of stage 154, setting the value of the component of the integrated-circuit chip may comprise adjusting the value of the component dynamically in response to changing resonant frequency of the radiating element. For example, the controller 84 may set the capacitance value of the fine-adjustment element 80 in response to indications from the controller 38, e.g., indicating a value of the fine-adjustment element 80 to be used or indicating one or more measured environmental conditions.

Configurations other than those discussed above may be used. For example, referring to FIG. 7, with further reference to FIG. 2, an aperture tuner 170 (which may be another example of the aperture tuner 34 shown in FIG. 2) may be configured similarly to the aperture tuner 34 shown in FIG. 4, with the aperture tuner 170 including an IC chip 160 that is slightly different than the IC chip 60 shown in FIG. 4. The IC chip 160 has a fine-adjustment element 162 and an electrostatic-discharge short 164 that are similar to the fine-adjustment element 80 and the electrostatic-discharge short 82 shown in FIG. 4, but instead of being coupled to the pin 70 as shown in FIG. 4, the element 162 and the discharge short 164 are coupled to a pin 166 that is configured to be coupled to one of the pins 66, 67, 68, 69, or 70. For example, the pin 166 may be wired to one of the pins 66, 67, 68, 69, or 70 during manufacture. Which of the pins 66-70 the pin 166 is coupled to may depend on a purpose of the radiating element 32. For example, the pin 166 may be selectively coupled to one of the pins 66-70 depending on whether the radiating element 32 is a cellular antenna (and/or depending on a band of the cellular antenna), a Wi-Fi antenna, a Bluetooth® antenna, etc. The pin 166 may be selectively coupled to one or more of the pins 66-70, e.g., through a switch 172 (that is optional, as indicated by the dashed line in FIG. 7) controlled by a controller 168 of the IC chip 160 (although in other configurations the controller 168 may be disposed off the IC chip 160). Alternatively, the pin 166 may be permanently coupled (e.g., hard-wired by a PCB trace or wire jumper) to one or more of the pins 66-70, e.g., during manufacture of the aperture tuner 170. As another example, referring also to FIG. 8, a bottom 174 of the IC chip 160 may provide the pins 66-70, 166, and USID, VIO, DATA, GND, and CLK pins for the corresponding ports. The pin 166 may be hard-wire connected to one of the pins 66-70 by physically connecting a wire from the pin 166 to a desired one of the pins 66-70.

Figure 7:
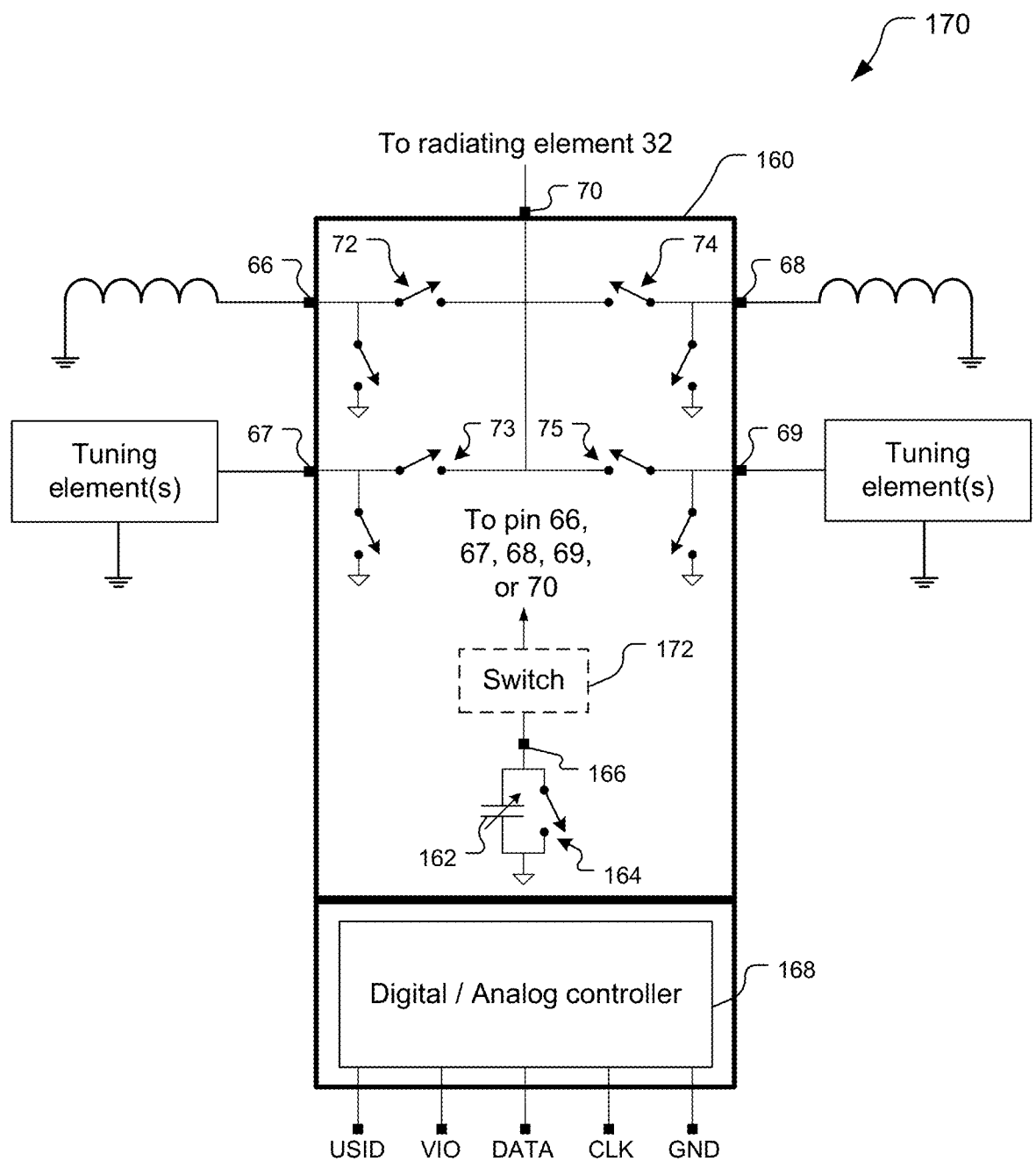
FIG. 7 is a block diagram of components of another example of the aperture tuner shown in FIG. 2.
Figure 8:
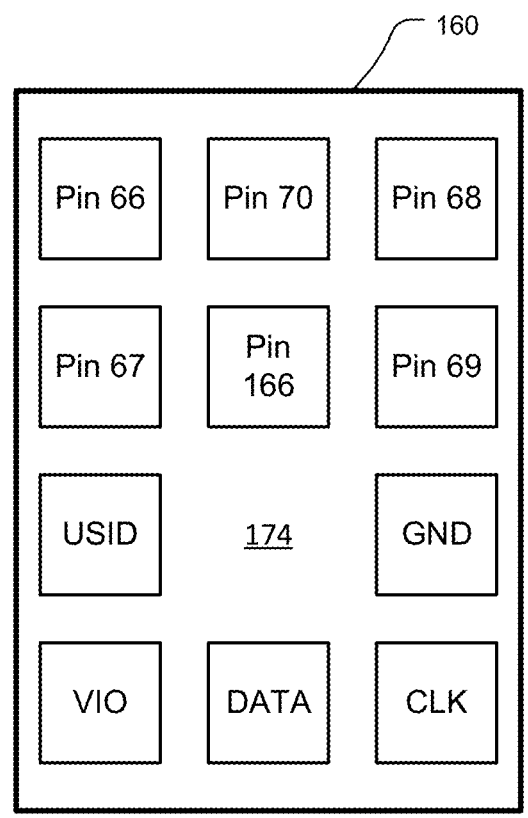
FIG. 8 is a block diagram of output pins of the aperture tuner shown in FIG. 7.

By using the configuration of FIG. 7, the fine-adjustment element 162 may be selectively coupled to the radiating element 32. The fine-adjustment element 162 may be connected in parallel with one of the external elements, and the parallel combination selectively connected (e.g., "permanently" (e.g., by a wire) or "temporarily" (e.g., via a switch)) to the radiating element 32. Further, with the respective one of the switches 72-75 open, the fine-adjustment element 162 may be isolated from the radiating element 32.

OTHER CONSIDERATIONS

Also, as used herein, "or" as used in a list of items prefaced by "at least one of" or prefaced by "one or more of" indicates a disjunctive list such that, for example, a list of "at least one of A, B, or C," or a list of "one or more of A, B, or C" means A or B or C or AB or AC or BC or ABC (i.e., A and B and C), or combinations with more than one feature (e.g., AA, AAB, ABBC, etc.).

As used herein, unless otherwise stated, a statement that a function or operation is "based on" an item or condition means that the function or operation is based on the stated item or condition and may be based on one or more items and/or conditions in addition to the stated item or condition.

Further, an indication that information is sent or transmitted, or a statement of sending or transmitting information, "to" an entity does not require completion of the communication. Such indications or statements include situations where the information is conveyed from a sending entity but does not reach an intended recipient of the information. The intended recipient, even if not actually receiving the information, may still be referred to as a receiving entity, e.g., a receiving execution environment. Further, an entity that is configured to send or transmit information "to" an intended recipient is not required to be configured to complete the delivery of the information to the intended recipient. For example, the entity may provide the information, with an indication of the intended recipient, to another entity that is capable of forwarding the information along with an indication of the intended recipient.

Substantial variations may be made in accordance with specific requirements. For example, customized hardware might also be used, and/or particular elements might be implemented in hardware, software (including portable software, such as applets, etc.) executed by a processor, or both. Further, connection to other computing devices such as network input/output devices may be employed.

The methods, systems, and devices discussed above are examples. Various configurations may omit, substitute, or add various procedures or components as appropriate. For instance, in alternative configurations, the methods may be performed in an order different from that described, and that various steps may be added, omitted, or combined. Also, features described with respect to certain configurations may be combined in various other configurations. Different aspects and elements of the configurations may be combined in a similar manner. Also, technology evolves and, thus, many of the elements are examples and do not limit the scope of the disclosure or claims.

Specific details are given in the description to provide a thorough understanding of example configurations (including implementations). However, configurations may be practiced without these specific details. For example, well-known circuits, processes, algorithms, structures, and techniques have been shown without unnecessary detail in order to avoid obscuring the configurations. This description provides example configurations only, and does not limit the scope, applicability, or configurations of the claims. Rather, the preceding description of the configurations provides a description for implementing described techniques. Various changes may be made in the function and arrangement of elements without departing from the spirit or scope of the disclosure.

Also, configurations may be described as a process which is depicted as a flow diagram or block diagram. Although each may describe the operations as a sequential process, many of the operations can be performed in parallel or concurrently. In addition, the order of the operations may be rearranged. A process may have additional stages or functions not included in the figure. Furthermore, examples of the methods may be implemented by hardware, software, firmware, middleware, microcode, hardware description languages, or any combination thereof. When implemented in software, firmware, middleware, or microcode, the program code or code segments to perform the tasks may be stored in a non-transitory computer-readable medium such as a storage medium. Processors may perform the described tasks.

Components, functional or otherwise, shown in the figures and/or discussed herein as being coupled, connected, or communicating with each other are communicatively coupled. That is, they may be directly or indirectly connected, possibly wirelessly connected, to enable communication between them. Further, components described as being coupled are directly or indirectly (e.g., via another component such as a switch, a resistor, etc.) electrically connected, e.g., via a wire or other conductive connector.

Having described several example configurations, various modifications, alternative constructions, and equivalents may be used without departing from the spirit of the disclosure. For example, the above elements may be components of a larger system, wherein other rules may take precedence over or otherwise modify the application of the invention. Also, a number of operations may be undertaken before, during, or after the above elements are considered. Accordingly, the above description does not bound the scope of the claims.

Further, more than one invention may be disclosed.

The invention claimed is:

1. An antenna system comprising:
   a radiating element;
   a feed coupled to the radiating element at a first point on the radiating element and configured to convey energy to the radiating element; and
   a radiation-adjustment device coupled to the radiating element at a second point on the radiating element different from the first point, the radiation-adjustment device being configured to alter a radiation characteristic of the radiating element and comprising:
      a plurality of coarse-adjustment elements;
      an integrated-circuit chip comprising:
         a plurality of switches each coupled to a respective one of the plurality of coarse-adjustment elements and a pin, wherein the plurality of coarse-adjustment elements are disposed external to the integrated-circuit chip, and wherein the pin is coupled to the radiating element at the second point; and
         a fine-adjustment circuit coupled to the pin; and
      a controller communicatively coupled to the plurality of switches and to the fine-adjustment circuit, the controller being configured to alter the radiation characteristic of the radiating element by selectively causing one or more of the plurality of switches to couple one or more of the plurality of coarse-adjustment elements to the radiating element via the pin, and by adjusting a value of the fine-adjustment circuit,
      wherein the plurality of switches is a plurality of first switches, wherein a first port of each of the plurality of first switches is coupled to the radiating element, wherein a second port of each of the plurality of first switches is coupled to a respective one of the plurality of coarse-adjustment elements, and wherein the radiation-adjustment device further comprises a plurality of second switches each coupled between the second port of a respective one of the plurality of first switches and a local ground on the integrated-circuit chip.

2. The antenna system of claim 1, wherein the plurality of coarse-adjustment elements comprise one or more inductors, or one or more capacitors, or a combination thereof.

3. The antenna system of claim 1, wherein the fine-adjustment circuit comprises a variable capacitor.

4. The antenna system of claim 1, wherein the controller is configured to adjust the value of the fine-adjustment circuit dynamically in response to changing resonant frequency of the radiating element.

5. The antenna system of claim 1, wherein the fine-adjustment circuit is coupled to a local ground on the integrated-circuit chip.

6. The antenna system of claim 1, wherein the plurality of coarse-adjustment elements and a fine-adjustment element of the fine-adjustment circuit are complementary metal-oxide semiconductor devices.

7. The antenna system of claim 1, wherein the radiation characteristic is radiation efficiency.

8. The antenna system of claim 1, wherein the fine-adjustment circuit is coupled to the radiating element.

9. The antenna system of claim 1, wherein the fine-adjustment circuit is coupled to at least one of the plurality of switches.

10. The antenna system of claim 1, wherein the integrated-circuit chip includes the controller.

11. A wireless communication device comprising:
a housing;
a display retained by the housing;
a printed circuit board communicatively coupled to the display and disposed in the housing; and
an antenna communicatively coupled to the printed circuit board, disposed in the housing, and comprising:
a radiating element comprising a strip of metal disposed proximate to a wall of the housing;
a feed coupled to the radiating element at a first location, the feed configured to provide signals to the radiating element; and
an aperture tuner coupled to the radiating element at a second location, displaced from the first location, the aperture tuner comprising an integrated-circuit chip and a band-selecting tuning element disposed external to the integrated-circuit chip, the integrated circuit chip configured to selectively couple the band-selecting tuning element to the radiating element at the second location such that the radiating element will radiate with at least a threshold level of efficiency over a first frequency band while coupled to the band-selecting tuning element and over a second frequency band, separate from the first frequency band, while isolated from the band-selecting tuning element, the integrated-circuit chip including a fine-tuning element configured to be coupled to the second location and to adjust a resonant frequency of the radiating element within the first frequency band and the second frequency band,
wherein the integrated-circuit chip comprises a first switch having a first port coupled to the radiating element at the second location and a second port coupled to the band-selecting tuning element, the integrated-circuit chip further comprising a second switch coupled between the second port of the first switch and a local ground on the integrated-circuit chip.

12. The device of claim 11, wherein the band-selecting tuning element comprises an inductor.

13. The device of claim 11, wherein the fine-tuning element comprises a variable capacitor.

14. The device of claim 11, wherein the fine-tuning element is coupled to the radiating element.

15. The antenna of claim 11, wherein the fine-tuning element is selectively coupled to the band-selecting tuning element.

16. The device of claim 11, wherein the aperture tuner comprises a first band-selecting tuning element, the aperture tuner further comprising a second band-selecting tuning element, the integrated circuit chip configured to selectively couple to the second band-selecting tuning element such that the radiating element will radiate with at least the threshold level of efficiency over a third frequency band, separate from the first frequency band and the second frequency band, while coupled to the second band-selecting tuning element.

17. The device of claim 11, wherein the aperture tuner comprises a plurality of band-selecting tuning elements each selectively coupled to the integrated-circuit chip such that the aperture tuner is configured to cause the radiating element to radiate with at least the threshold level of efficiency over a selected one of a plurality of frequency bands including the first frequency band and the second frequency band.

18. The device of claim 17, wherein a lowest frequency in the plurality of frequency bands is separated by at least 600 MHz from a highest frequency in the plurality of frequency bands.

19. The device of claim 17, wherein the plurality of band-selecting tuning elements comprises two or more inductors, or two or more capacitors, or a combination of one or more inductors and one or more capacitors.

20. The device of claim 11, further comprising a controller configured to cause a value of the fine-tuning element to change in response to a change in the resonant frequency of the radiating element.

21. The device of claim 20, wherein the controller is configured to cause the value of the fine-tuning element to change to counteract the change in the resonant frequency of the radiating element.

22. An antenna comprising:
radiating means for radiating electromagnetic energy, the radiating means comprising a first location and a second location spaced apart;
signal means for providing a signal to the radiating means at the first location;
means for tuning the radiating means to have a reflection coefficient below a threshold value over a desired frequency band; and
an integrated circuit coupled to the means for tuning, the means for tuning being external to the integrated circuit, the integrated circuit comprising:
means for selecting the means for tuning;
means for adjusting the means for tuning to adjust the desired frequency band; and
means for coupling the means for tuning and the means for adjusting to the second location, the means for coupling comprising a first switch having a first port coupled to the radiating means at the second location and a second port coupled to the means for tuning, the means for coupling further comprising a second switch coupled between the second port of the first switch and a local ground on the integrated circuit.

23. The antenna of claim 22, wherein the means for tuning are for tuning the radiating means to have the reflection coefficient below the threshold value over a selected one of a first plurality of desired frequency bands having center frequencies separated by first increments, and wherein the means for adjusting are for adjusting the means for tuning to adjust the desired frequency band to an adjusted frequency band between adjacent ones of the first plurality of desired frequency bands.

24. The antenna of claim 23, wherein the means for adjusting are for adjusting the means for tuning to adjust the desired frequency band to a selected one of a second plurality of desired frequency bands having center frequencies separated by second increments that are smaller than the first increments.

25. An antenna aperture tuner comprising:
an output pin configured to be coupled to a radiating element;
a plurality of coarse-adjustment pins;
a plurality of switches each coupled to the output pin and to a corresponding one of the plurality of coarse-adjustment pins;
a fine-adjustment circuit coupled to the output pin;
a controller communicatively coupled to the plurality of switches and to the fine-adjustment circuit;
a Unique Slave Identifier port;
a Voltage Input/Output port;
a data port;
a clock port; and
a ground port,
wherein the plurality of switches are configured to couple one or more of the plurality of coarse-adjustment pins to the output pin, wherein the fine-adjustment circuit is configured to provide a selectable reactance to the output pin, and wherein the controller is coupled to the Unique Slave Identifier port, the Voltage Input/Output port, the data port, the clock port, and the ground port.

26. The antenna aperture tuner of claim 25, wherein the controller is configured to actuate the plurality of switches to couple one or more of the plurality of coarse-adjustment pins to the output pin and to control the fine-adjustment circuit to provide a selected reactance to the output pin.

27. The antenna aperture tuner of claim 26, wherein the controller is configured to control the fine-adjustment circuit dynamically in response to changing resonant frequency of the radiating element.

28. The antenna aperture tuner of claim 25, wherein the fine-adjustment circuit comprises a variable capacitor in parallel with a discharge short.

* * * * *